US012803247B2

(12) United States Patent
Yao et al.

(10) Patent No.: US 12,803,247 B2
(45) Date of Patent: Nov. 17, 2026

(54) OPTICAL SEMICONDUCTOR DEVICE

(71) Applicant: FURUKAWA ELECTRIC CO., LTD., Tokyo (JP)

(72) Inventors: Kenichiro Yao, Tokyo (JP); Masaki Wakaba, Tokyo (JP); Toshihito Suzuki, Chiba (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 635 days.

(21) Appl. No.: 18/366,894

(22) Filed: Aug. 8, 2023

(65) Prior Publication Data

US 2023/0387663 A1 Nov. 30, 2023

Related U.S. Application Data

(63) Continuation of application No. PCT/JP2022/002870, filed on Jan. 26, 2022.

(30) Foreign Application Priority Data

Feb. 12, 2021 (JP) ................................ 2021-020442

(51) Int. Cl.
*H01S 5/22* (2006.01)
*H01S 5/024* (2006.01)
*H01S 5/026* (2006.01)

(52) U.S. Cl.
CPC ............ *H01S 5/22* (2013.01); *H01S 5/02453* (2013.01); *H01S 5/026* (2013.01)

(58) Field of Classification Search
CPC .................................................. H01S 5/02453
See application file for complete search history.

(56) References Cited

U.S. PATENT DOCUMENTS 6,773,615 B1 8/2004 Rogers et al.
2007/0230856 A1* 10/2007 Yamazaki ............ G02F 1/0147 385/5

(Continued)

FOREIGN PATENT DOCUMENTS

JP 2000-187192 A 7/2000
JP 2015-22092 A 2/2015

(Continued)

OTHER PUBLICATIONS

English Translation of Iwai (Year: 2017).*

(Continued)

*Primary Examiner* — Minsun O Harvey
(74) *Attorney, Agent, or Firm* — Oblon, McClelland, Maier & Neustadt, L.L.P.

(57) ABSTRACT

An optical semiconductor device includes: a base including a surface intersecting with a first direction; a mesa protruding from the surface in the first direction, including a top surface and two side surfaces, and extending along the surface in a direction intersecting the first direction; and a heater layer including a top wall positioned on a side opposite to the base with respect to the top surface, the heater layer extending along the mesa, the mesa including a first mesa extending in a second direction intersecting the first direction, and a plurality of second mesas branching from the first mesa and extending so as to be away from each other in a third direction toward the second direction from the first mesa, the third direction intersecting both of the first direction and the second direction.

20 Claims, 18 Drawing Sheets

(56) References Cited

U.S. PATENT DOCUMENTS

| | | | |
|---|---|---|---|
| 2015/0316794 A1 | 11/2015 | Hayakawa | |
| 2017/0155451 A1 | 6/2017 | Hayakawa | |
| 2019/0363516 A1* | 11/2019 | Higa | H01S 5/0612 |
| 2020/0212651 A1 | 7/2020 | Nagarajan et al. | |

FOREIGN PATENT DOCUMENTS

| | | | |
|---|---|---|---|
| JP | 2016-54168 A | | 4/2016 |
| JP | 2017161830 A | * | 9/2017 |
| JP | 2020-136297 A | | 8/2020 |
| JP | 2020-136360 A | | 8/2020 |
| WO | WO 2020/162451 A1 | | 8/2020 |

OTHER PUBLICATIONS

Japanese Notice of Reasons for Refusal issued Mar. 4, 2025 in Japanese Application No. 2021-020442 with English translation, 8 pgs.

International Search Report issued Mar. 8, 2022 in PCT/JP2022/002870 filed on Jan. 26, 2022, 3 pages.

* cited by examiner

OPTICAL SEMICONDUCTOR DEVICE

REFERENCE TO RELATED APPLICATION(S)

This application is a continuation of International Application No. PCT/JP2022/002870, filed on Jan. 26, 2022 which claims the benefit of priority of the prior Japanese Patent Application No. 2021-020442, filed on Feb. 12, 2021, the entire contents of which are incorporated herein by reference.

BACKGROUND OF THE INVENTION

The present disclosure relates to an optical semiconductor device.

In the related art, an optical semiconductor device including a heater layer on a mesa is known (JP 2016-054168 A).

SUMMARY OF THE INVENTION

In this type of optical semiconductor device, for example, it is advantageous if it is possible to improve reliability by avoiding an inconvenient event caused by providing the heater layer.

Therefore, it is desirable to provide an optical semiconductor device having an improved novel configuration such as a configuration capable of improving reliability.

In some embodiments, an optical semiconductor device includes: a base including a surface intersecting with a first direction; a mesa protruding from the surface in the first direction, including a top surface and two side surfaces, and extending along the surface in a direction intersecting the first direction; and a heater layer including a top wall positioned on a side opposite to the base with respect to the top surface, the heater layer extending along the mesa, the mesa including a first mesa extending in a second direction intersecting the first direction, and a plurality of second mesas branching from the first mesa and extending so as to be away from each other in a third direction toward the second direction from the first mesa, the third direction intersecting both of the first direction and the second direction, each of the second mesas including a first side surface close to another second mesa adjacent in the third direction, and a second side surface far from the another adjacent second mesa, the heater layer including a first side wall provided in at least one of the second mesas, the first side wall extending from a position away from the first mesa along the first side surface so as to be away from the first mesa.

In some embodiments, an optical semiconductor device includes: a base including a surface intersecting with a first direction; a mesa protruding from the surface in the first direction, including a top surface and two side surfaces, and extending along the surface in a direction intersecting the first direction; and a heater layer including a top wall positioned on a side opposite to the base with respect to the top surface, the heater layer extending along the mesa, the mesa including a first mesa extending in a second direction intersecting the first direction, a plurality of second mesas branching from the first mesa at an end of the first mesa in the second direction and extending so as to be away from each other in a third direction toward the second direction from the first mesa, the third direction intersecting both of the first direction and the second direction, and a plurality of third mesas branching from the first mesa at an end of the first mesa in a direction opposite to the second direction and extending so as to be away from each other in the third direction toward the direction opposite to the second direction from the first mesa, each of the second mesas and each of the third mesas including a first side surface close to either another second mesa or another third mesa adjacent in the third direction, and a second side surface far from either the another adjacent second mesa or the another adjacent third mesa, the heater layer being not provided in the first mesa, the heater layer including a second heater layer provided in a portion that is included in the second mesas and that is away from the first mesa, and a third heater layer provided in a portion that is included in the third mesas that is away from the first mesa, the second heater layer and the third heater layer including at least one of a first side wall extending along the first side surface and a second side wall extending along the second side surface.

In some embodiments, an optical semiconductor device includes: a base including a surface intersecting with a first direction; a mesa protruding from the surface in the first direction, including a top surface and two side surfaces, and extending along the surface in a direction intersecting the first direction; and a heater layer including a top wall positioned on a side opposite to the base with respect to the top surface, the heater layer extending along the mesa, the mesa including a first mesa extending in a second direction intersecting the first direction, and a plurality of second mesas branching from the first mesa and extending so as to be away from each other in a third direction toward the second direction from the first mesa, the third direction intersecting both of the first direction and the second direction, each of the second mesas including a first side surface close to another second mesa adjacent in the third direction, and a second side surface far from the another adjacent second mesa, the heater layer including a first heater layer extending along the first mesa, and a second heater layer connected to the first heater layer and extending along the second mesa, the second heater layer being provided at an end of a second mesa provided with the second heater layer, the end of the second mesa being adjacent to the first mesa, the second heater layer being spaced another adjacent second mesa.

The above and other objects, features, advantages and technical and industrial significance of this disclosure will be better understood by reading the following detailed description of presently preferred embodiments of the disclosure, when considered in connection with the accompanying drawings.

DETAILED DESCRIPTION

Hereinafter, embodiments of the disclosure are disclosed. The configurations of the embodiments described below, and the functions and results (effects) provided by the configurations are examples. The disclosure can also be realized by configurations other than those disclosed in the following embodiments. Furthermore, according to the disclosure, it is possible to obtain at least one of various effects (including derivative effects) obtained by the configuration.

A plurality of embodiments described below have similar configurations. Therefore, according to the configuration of each embodiment, similar functions and effects based on the similar configuration can be obtained. Furthermore, in the following description, similar reference signs are given to similar configurations, and redundant description may be omitted.

In the present specification, ordinal numbers are given for convenience to distinguish portions, directions, and the like, and do not indicate priority or order.

Furthermore, in each drawing, an X direction is represented by an arrow X, a Y direction is represented by an arrow Y, and a Z direction is represented by an arrow Z. The X direction, the Y direction, and the Z direction intersect each other and are orthogonal to each other.

First Embodiment

Figure 1:
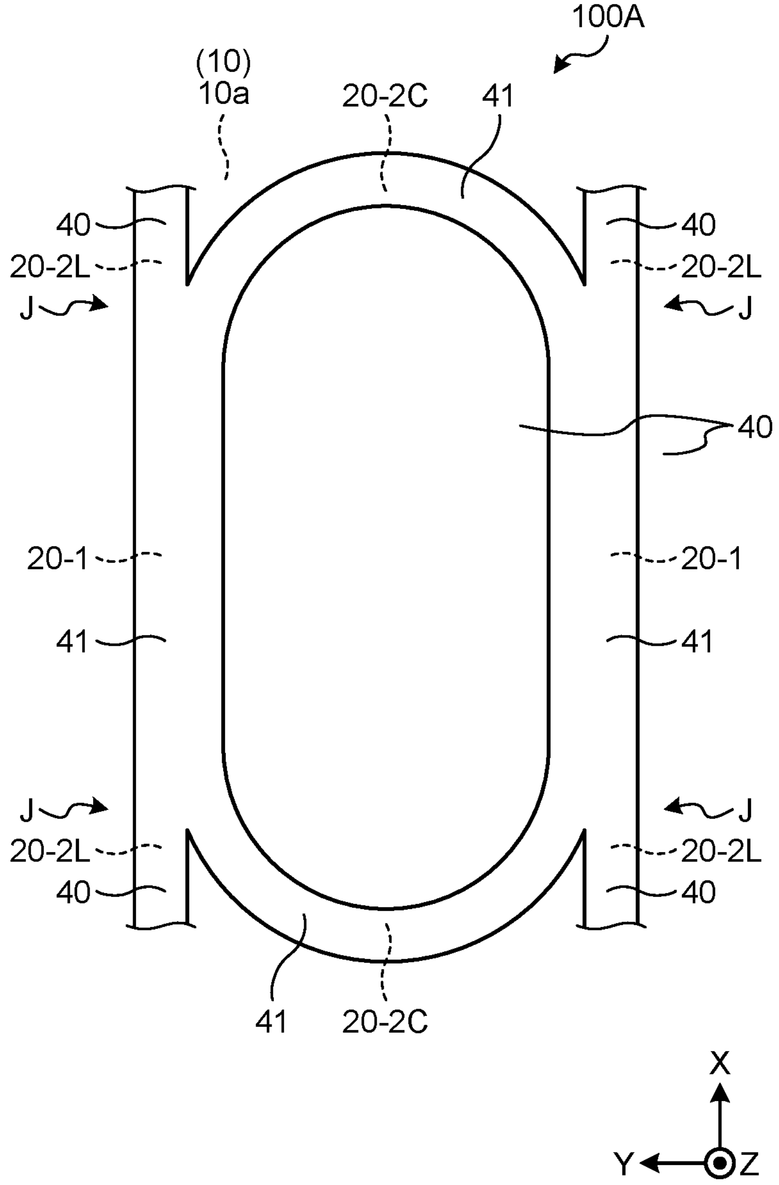
FIG. 1 is an exemplary schematic plan view of an optical semiconductor device according to a first embodiment.

FIG. 1 is a plan view of an optical semiconductor device 100A of a first embodiment. As illustrated in FIG. 1, the optical semiconductor device 100A includes a base 10 and mesas 20-1, 20-2L, and 20-2C. As an example, the optical semiconductor device 100A can constitute a ring resonator.

The base 10 is, for example, a semiconductor substrate, intersects with and is orthogonal to the Z direction, and extends in the X direction and the Y direction. The base 10 has a surface **10*a*. The surface 10*a* intersects with and is orthogonal to the Z direction, and extends in the X direction and the Y direction. The base 10 is made of, for example, a group III-V semiconductor having a zinc blende structure such as n-type indium phosphide (InP). The base 10 may also be referred to as a substrate. The surface 10*a*** is an example of the surface.

The mesas 20-1, 20-2L, and 20-2C have a shape like a wall protruding from the surface **10*a* and extending along the surface 10*a***. The Z direction is an example of a first direction.

The optical semiconductor device 100A includes two mesas 20-1, four mesas 20-2L, and two mesas 20-2C. Heights of the plurality of mesas 20-1, 20-2L, and 20-2C included in the optical semiconductor device 100A from the surface **10*a*** in the Z direction are substantially the same.

As illustrated in FIG. 1, when viewed in an opposite direction of the Z direction, the two mesas 20-1 have substantially the same shape and dimension, and are arranged in parallel. Each of the mesas 20-1 has a rectangular shape elongated in the X direction. Each of the four mesas 20-2L extends in the X direction. The mesa 20-2L also has a rectangular shape elongated in the X direction. Furthermore, each of the two mesas 20-2C has substantially the same shape and dimension, and is curved in a semicircular arc shape with a substantially constant width. The two mesas 20-2C are arranged line-symmetrically with respect to an imaginary center line passing through the center in the X direction and extending along the Y direction. A width of the mesa 20-2L and a width of the mesa 20-2C are substantially the same, and are substantially half a width of the mesa 20-1. The two mesas 20-1 and the two mesas 20-2C constitute a substantially oval circumferential mesa.

The mesa 20-1 extends in the X direction with a substantially constant width in the Y direction. The mesa 20-1 is an example of a first mesa, and the X direction or a direction opposite to the X direction is an example of a second direction.

The mesas 20-2L and 20-2C branch off from the mesa 20-1 at a branch portion J, and extend away from each other in the Y direction toward the X direction or the opposite direction of the X direction from the mesa 20-1. The mesa 20-2L extends linearly in the X direction with a substantially constant width in the Y direction, and the mesa 20-2C extends while being curved with a constant width. The mesas 20-2L and 20-2C are an example of a second mesa. The Y direction is an example of a third direction.

Furthermore, the base 10 and the mesas 20-1, 20-2L, and 20-2C are covered with a covering layer 40. Moreover, the mesas 20-1 and 20-2C are covered with a heater layer 30 (see FIG. 2), and the heater layer 30 is further covered with a covering layer 41.

Figure 2:
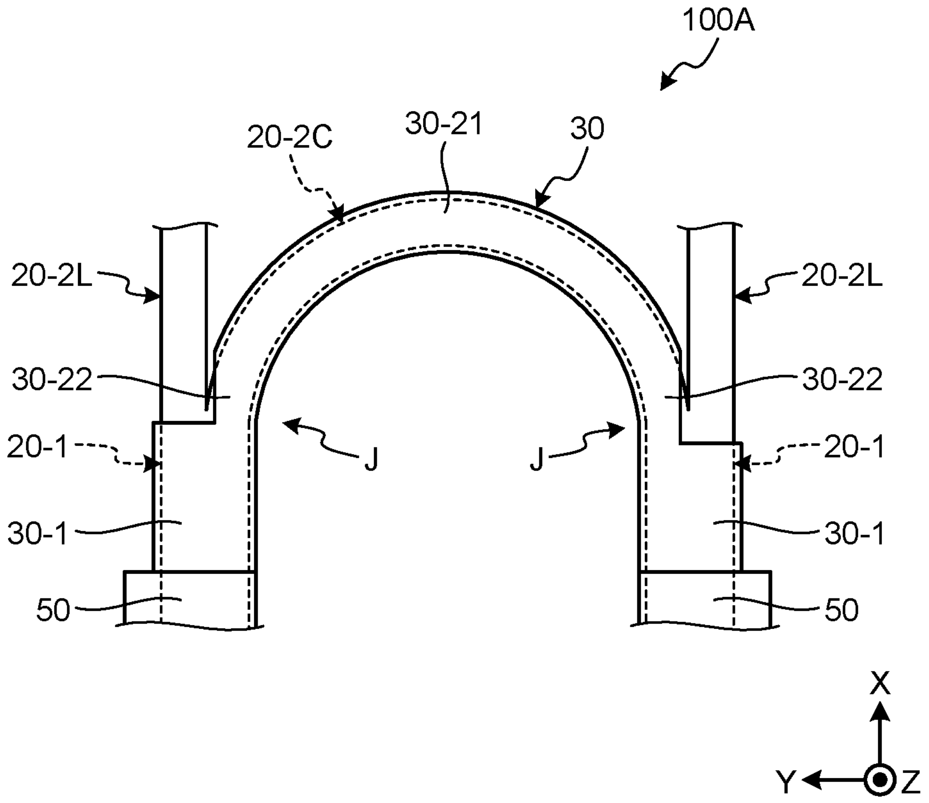
FIG. 2 is an exemplary schematic plan view illustrating a mesa, a heater layer, and a wiring layer of a part of the optical semiconductor device according to the first embodiment.

FIG. 2 is a plan view illustrating the mesas 20-1, 20-2L, and 20-2C, the heater layer 30, and a wiring layer 50, excluding the covering layers 40 and 41, of a part of the optical semiconductor device 100A.

The heater layer 30 is an electric resistor that generates heat by energization, and is made of, for example, a thermoelectric material such as tungsten or an alloy thereof. Furthermore, the wiring layer 50 is made of a highly conductive material such as gold, for example.

As illustrated in FIG. 2, the heater layer 30 has a section 30-1 extending along the mesa 20-1 and sections 30-21 and 30-22 extending along the mesa 20-2C. The sections 30-22, 30-21, 30-22, and 30-1 are connected in series in this order to constitute a series of the heater layers 30. The section 30-21 is away from the section 30-1. Furthermore, the section 30-22 is located closer to the section 30-1 than the section 30-21, and is located between the section 30-21 and the section 30-1. The section 30-1 is an example of a first heater layer, and the sections 30-21 and 30-22 are examples of a second heater layer. Furthermore, the section 30-21 is an example of a first portion and a third portion, and the section 30-22 is an example of a second portion and a fourth portion.

The wiring layer 50 is connected to each of the two sections 30-1. When a predetermined voltage is applied to the two wiring layers 50, the heater layer 30 is energized and generates heat.

Here, the section 30-1 extends along the mesa 20-1 with a width wider than the sections 30-21 and 30-22 when viewed in the opposite direction of the Z direction. As a result, the cross-sectional area of the heater layer 30 is increased in the section 30-1, so that the electric resistance can be further reduced. As a result, for example, the heating efficiency by the heater layer 30 can be enhanced, or the reliability can be enhanced by suppressing the local excessive temperature rise of the optical semiconductor device 100A.

Figure 3:
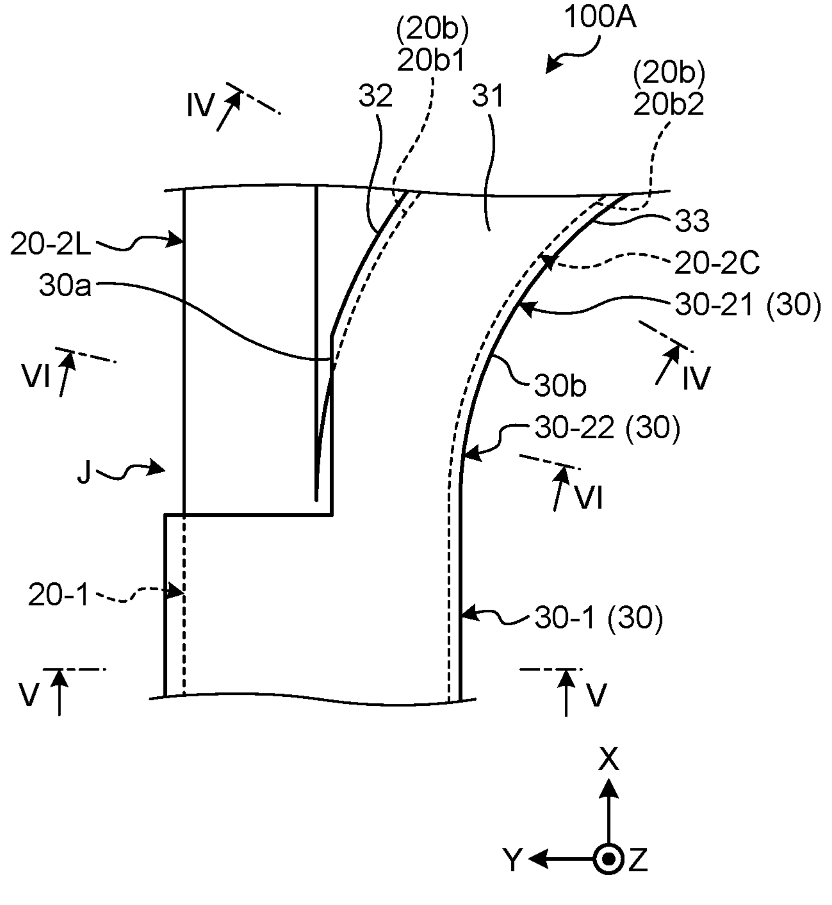
FIG. 3 is an exemplary schematic plan view illustrating a mesa and a heater layer in the vicinity of a branch portion of the optical semiconductor device according to the first embodiment.
Figure 5:
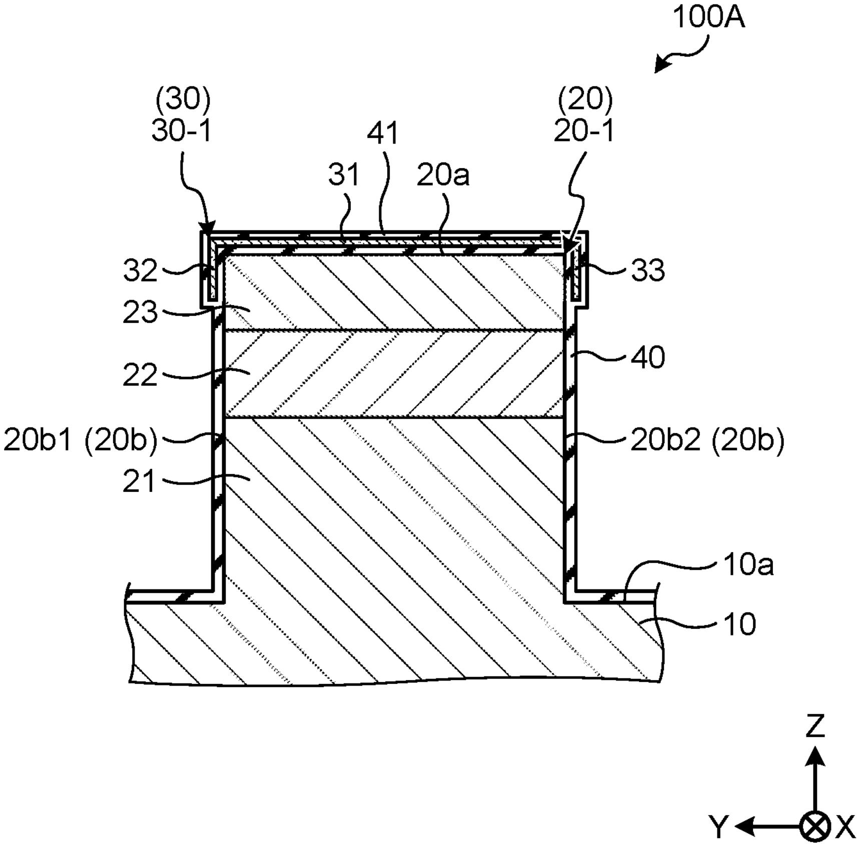
FIG. 5 is an exemplary schematic cross-sectional view of the optical semiconductor device taken along line V-V in FIG. 3.
Figure 6:
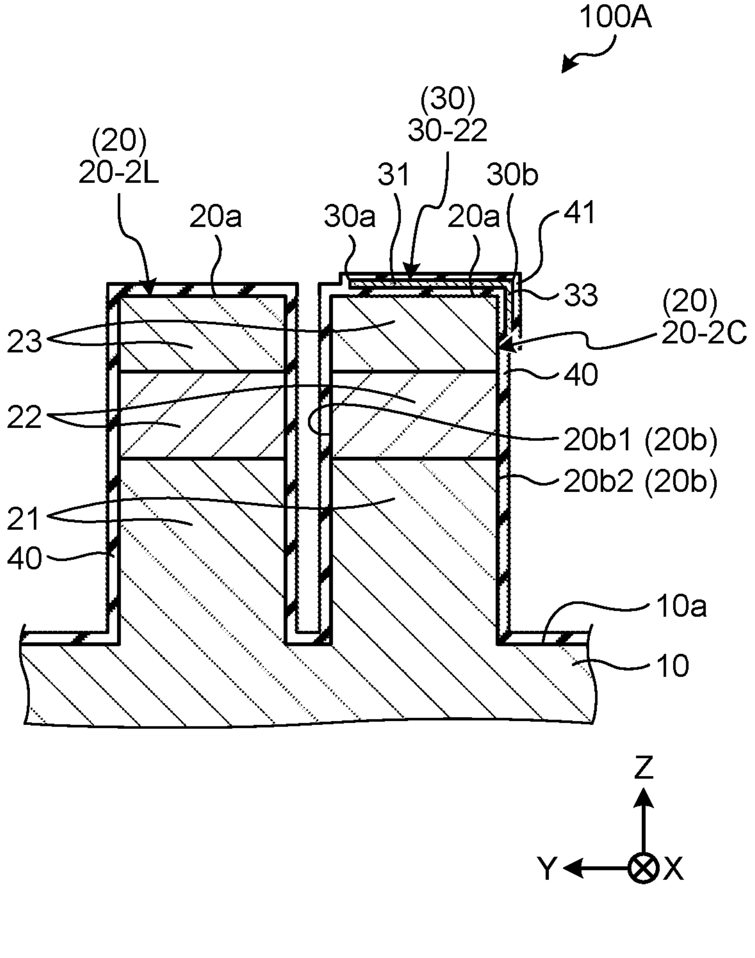
FIG. 6 is an exemplary schematic cross-sectional view of the optical semiconductor device taken along line VI-VI in FIG. 3.

FIG. 3 is a plan view of the mesas 20-1, 20-2L, and 20-2C and the heater layer 30 in the vicinity of the branch portion J. Furthermore, FIG. 4 is a cross-sectional view of the optical semiconductor device 100A taken along line IV-IV in FIG. 3, FIG. 5 is a cross-sectional view of the optical semiconductor device 100A taken along line V-V in FIG. 3, and FIG. 6 is a cross-sectional view of the optical semiconductor device 100A taken along line VI-VI in FIG. 3.

Figure 4:
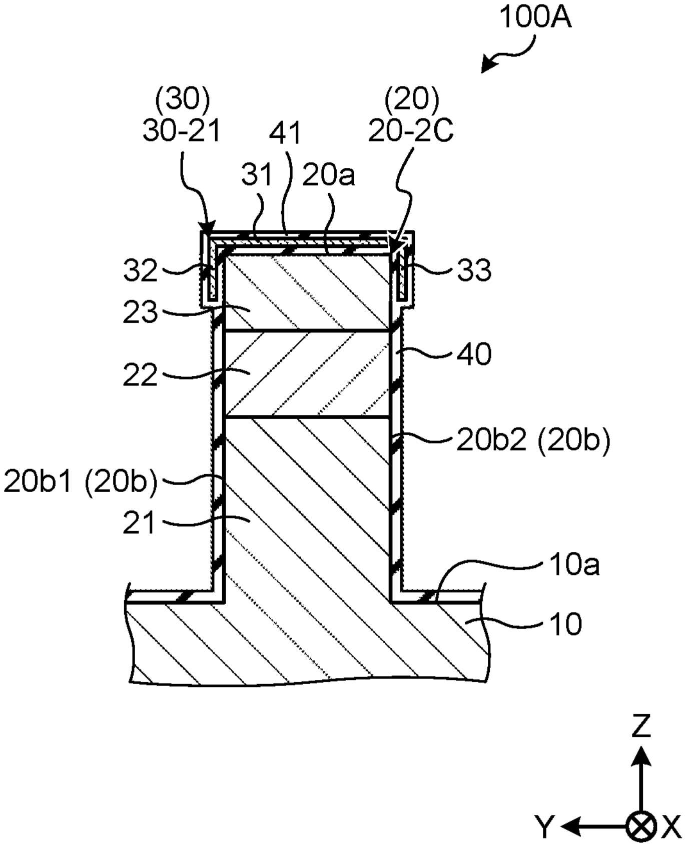
FIG. 4 is an exemplary schematic cross-sectional view of the optical semiconductor device taken along line IV-IV in FIG. 3.

FIG. 4 is a cross-sectional view of the mesa 20-2C (20). The mesa 20-2C has a top surface 20*a* and two side surfaces 20*b* (20*b*1 and 20*b*2). In the cross section, the section 30-21 of the heater layer 30 is provided in the mesa 20-2C.

The top surface 20*a* intersects with and is orthogonal to the Z direction. The top surface 20*a* is substantially parallel to the surface 10*a*.

The side surface 20*b* extends in the Z direction. Furthermore, the side surface 20*b* has a substantially constant width in the Z direction and extends in a direction intersecting the Z direction.

Here, as will be apparent with reference to FIG. 3, out of the two side surfaces 20*b*, the side surface 20*b*1 is closer to another mesa 20-2L adjacent in the Y direction at the branch portion J, and the side surface 20*b*2 is farther from the another mesa 20-2L. The side surface 20*b*1 is an example of a first side surface, and the side surface 20*b*2 is an example of a second side surface.

Furthermore, as illustrated in FIG. 4, the mesa 20-2C includes a cladding layer 21, a waveguide layer 22, and a cladding layer 23. The cladding layer 21, the waveguide layer 22, and the cladding layer 23 are arranged in this order in the Z direction. That is, the waveguide layer 22 is sandwiched between the cladding layers 21 and 23.

The mesa 20-2C can be manufactured by a known semiconductor manufacturing process. The cladding layers 21 and 23 function as claddings for the waveguide layer 22 as a core. The cladding layers 21 and 23 can be made of a material having a refractive index lower than that of the waveguide layer 22. As an example, in a case where a wavelength of light guided by the waveguide layer 22 is 1.55 [μm], the cladding layers 21 and 23 are made of InP, and the waveguide layer 22 is made of InGaAsP. Note that the materials of the waveguide layer 22 and the cladding layers 21 and 23 are not limited to this example, and can be appropriately set according to a wavelength of light transmitted by the waveguide layer 22.

The surface 10*a* of the base 10, and the top surface 20*a* and the side surface 20*b* of the mesa 20-2C are covered with the covering layer 40 having an insulating property. The covering layer 40 is formed on each surface with a substantially constant thickness. The covering layer 40 is made of, for example, a dielectric such as silicon nitride ($SiN_x$) or silicon dioxide ($SiO_2$). Furthermore, the heater layer 30 is covered with the covering layer 41 made of the same type of material as the covering layer 40. In such a configuration, the heater layer 30 is covered with the covering layers 40 and 41.

The section 30-21 (30) of the heater layer 30 has a top wall 31 and two side walls 32 and 33. As described above, since the heater layer 30 has the two side walls 32 and 33 in addition to the top wall 31, a cross-sectional area of the heater layer 30 can be further increased and the electric resistance can be further reduced. As a result, for example, it is possible to obtain advantages that the heating efficiency by the heater layer 30 can be enhanced and the reliability can be enhanced by suppressing the local excessive temperature rise of the optical semiconductor device 100A.

The top wall 31 is provided on the top surface 20*a* of the mesa 20-2C via the covering layer 40. The top wall 31 has a substantially constant thickness and a substantially constant width and extends substantially along the top surface 20*a* of the mesa 20-2C. The top wall 31 is located on a side opposite to the base 10 with respect to the top surface 20*a*.

The side walls 32 and 33 are respectively provided on the side surfaces 20*b* of the mesa 20-2C with the covering layer 40 interposed therebetween. The side walls 32 and 33 have a substantially constant thickness and a substantially constant width in the Z direction, and extend along the side surfaces 20*b* of the mesa 20-2C. The side wall 32 extending along the side surface 20*b*1 is an example of a first side wall, and the side wall 33 extending along the side surface 20*b*2 is an example of a second side wall.

In the present embodiment, the top wall 31 and the two side walls 32 and 33 are integrally connected in each cross section. The top wall 31 and the two side walls 32 and 33 have a U-shape in a cross section orthogonal to an extending direction of the mesa 20-2C, and cover a tip of the mesa 20-2C. Furthermore, the top wall 31 and the two side walls 32 and 33 extend along the extending direction of the mesa 20-2C.

FIG. 5 is a cross-sectional view of the mesa 20-1 (20). The mesa 20-1 has substantially the same configuration as the mesa 20-2C although the width is different. A waveguide layer 22 of the mesa 20-1 and the waveguide layer of the mesa 20-2C are provided at the same position in the Z direction, are connected in the X direction, and are optically connected. The mesa 20-1 is provided with a section 30-1 of the heater layer 30.

FIG. 6 is a cross-sectional view of the mesas 20-2L and 20-2C (20).

The mesa 20-2L has substantially the same configuration as the mesa 20-2C. The waveguide layer 22 of the mesa 20-1 and a waveguide layer of the mesa 20-2L are provided at the same position in the Z direction, are connected in the X direction, and are optically connected. Furthermore, the heater layer 30 is not provided in the mesa 20-2L.

On the other hand, as will be apparent when FIG. 6 is compared with FIG. 4, in this portion, the section 30-22 of the heater layer 30 in the mesa 20-2C has a configuration different from the section 30-21 of the heater layer 30. Specifically, the heater layer 30 has the side wall 32 in the section 30-21 illustrated in FIG. 4, whereas the heater layer 30 does not have the side wall 32 in the section 30-22 illustrated in FIG. 6. Here, as also illustrated in FIG. 3, the section 30-22 is located closer to the section 30-1 than the section 30-21. That is, the heater layer 30 provided in the mesa 20-2C includes the section 30-21 having the side wall 32 away from the mesa 20-1, and the section 30-22 having no side wall 32 closer to the mesa 20-1 than the section 30-21.

In other words, in the mesa 20-2C, the side wall 32 of the heater layer 30 extends from a position away from the mesa 20-1 along the side surface **20*b*1 along the extending direction of the mesa 20-2C so as to be away from the mesa 20-1. Furthermore, the side wall 32 is separated from another mesa 20-2L adjacent to the mesa 20-2**C.

Moreover, as illustrated in FIG. 3, when viewed in the opposite direction of the Z direction, the sections 30-21 and 30-22 of the heater layer 30 have an end edge **30*a* closer to the side surface 20*b*1 than the side surface 20*b*2 of the mesa 20-2C and an end edge 30*b* closer to the side surface 20*b*2 than the side surface 20*b*1. Then, in the section 30-22, the end edge 30*a* approaches the side surface 20*b*2 as approaching the mesa 20-1, the section 30-1, and a root of the branch portion J. That is, in the section 30-22, the end edge 30*a* is located closer to the side surface 20*b*2 than the section 30-21. The end edge 30*a* is an example of a first end edge, and the end edge 30*b*** is an example of a second end edge.

As described above, in the heater layer 30 (sections 30-21 and 30-22) provided in the mesa 20-2C, the section 30-22 as an end close to the mesa 20-1 and adjacent to the mesa 20-1 is spaced from the mesa 20-2L.

Figure 7:
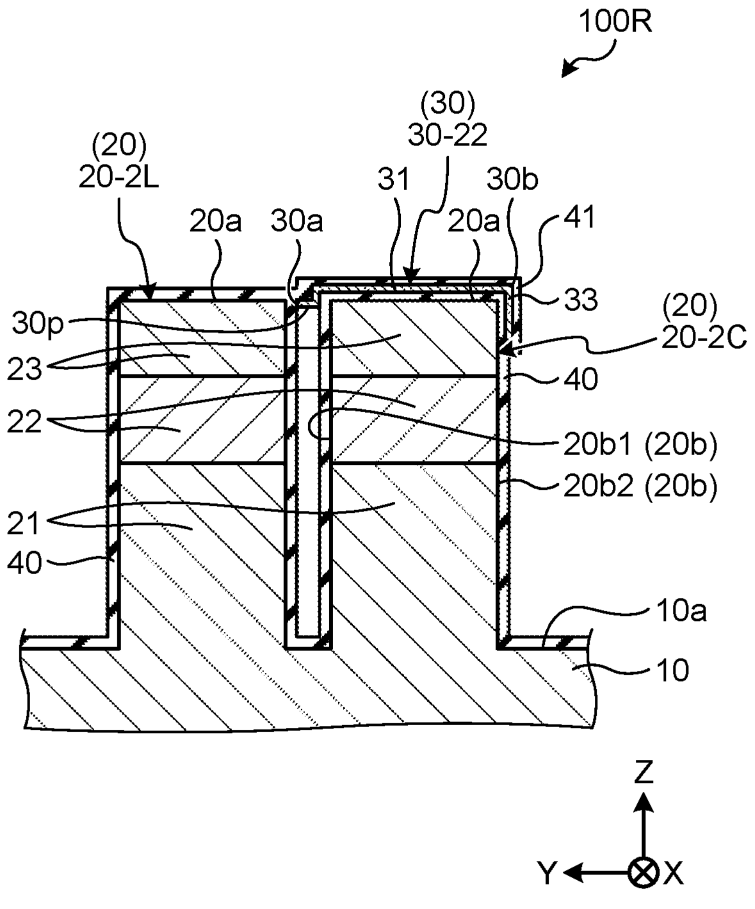
FIG. 7 is an exemplary and schematic cross-sectional view of an optical semiconductor device of a reference example at the same position as FIG. 6.

FIG. 7 is a cross-sectional view of an optical semiconductor device 100R of a reference example at the same position as FIG. 6. The inventors have conducted experimental studies on a configuration in which the heater layer 30 is provided on the mesa 20-2C. As a result, the inventors have found that in a portion where the mesas 20-2L and 20-2C are close to each other in the width direction, it is difficult for the heater layer 30 provided on the mesa 20-2C to be formed in a desired shape as illustrated in FIG. 7, and there is a case where an overhanging portion **30*p* overhanging to a side of the mesa 20-2L is formed beyond the side surface of the mesa 20-2C. Moreover, it has been found that such an overhanging portion 30*p* is more easily formed as a distance between the mesas 20-2L and 20-2C adjacent to each other is shorter, and the end edge 30*a* of the heater layer 30 is more easily formed as it is closer to the mesa 20-2L, and further more easily formed in a case where the side wall 32 close to the mesa 20-2L is provided. In addition, it has been found that, in a case where such an overhanging portion 30*p* is formed, the overhanging portion 30*p* is not covered by the covering layers 40 and 41 and is partially exposed from the covering layers 40 and 41**, and there is a possibility that the overhanging portion is easily oxidized.

Furthermore, in a case where there is a difference in thermal expansion coefficient between the mesas 20-2L and 20-2C and the heater layer 30, it has been found that the overhanging portion **30*p* presses or bites the mesa 20-2L due to thermal expansion or thermal contraction of the mesas 20-2L and 20-2C and the heater layer 30, so that the mesa 20-2**L may be damaged.

In this regard, as described above, in the present embodiment, in the heater layer 30 provided in the mesa 20-2C, the section 30-22 as an end close to the mesa 20-1 and adjacent to the mesa 20-1, in other words, as an end close to the branch portion J is spaced from the mesa 20-2L. According to such a configuration, for example, it is possible to avoid a situation in which the overhanging portion **30*p* of the heater layer 30 is formed and the overhanging portion 30*p* is exposed from the covering layers 40 and 41, so that the heater layer 30 is easily oxidized, and a situation in which the overhanging portion 30*p* damages the mesa 20-2L by thermal expansion or thermal contraction. That is, according to the present embodiment, for example, an inconvenient event caused by the provision of the heater layer 30 can be avoided, and the reliability of the optical semiconductor device 100A can be improved. Furthermore, according to the present embodiment, for example, it is also possible to obtain an advantage that the individual difference variation in the shape of the heater layer 30 increases in the vicinity of the branch portion J, and thus the individual difference variation in the heating performance by the heater layer 30** can be suppressed from increasing.

Second Embodiment

Figure 8:
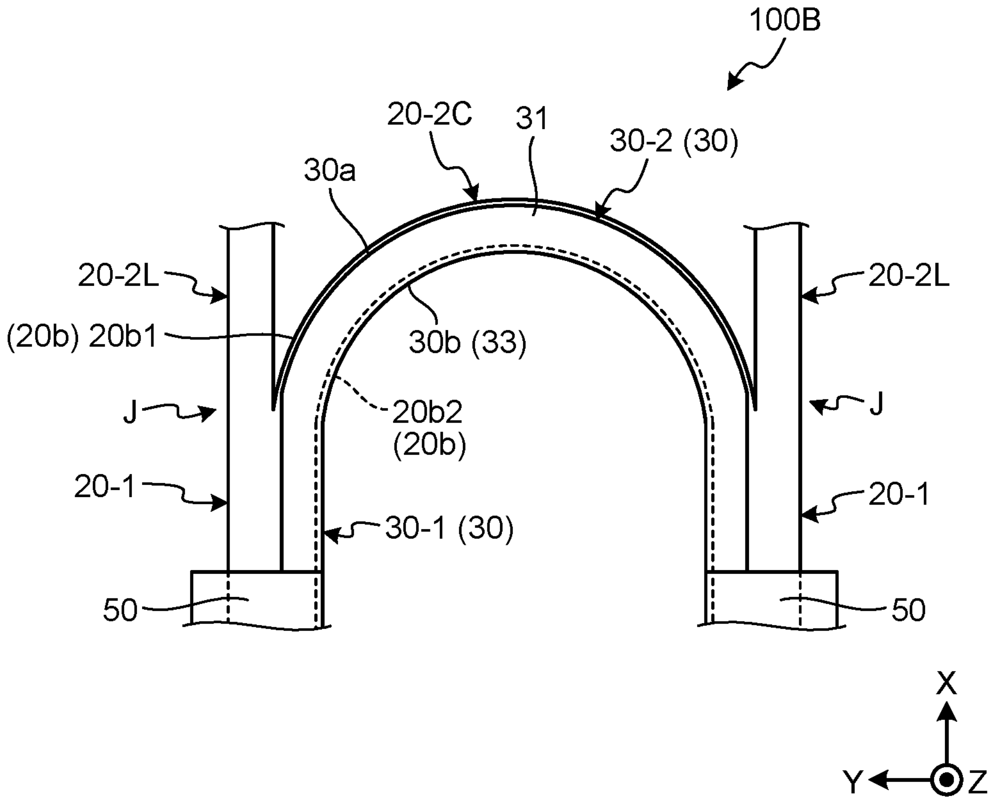
FIG. 8 is an exemplary schematic plan view illustrating a mesa, a heater layer, and a wiring layer of a part of an optical semiconductor device according to a second embodiment.

FIG. 8 is a plan view illustrating mesas 20-1, 20-2L, and 20-2C, heater layer 30, and wiring layer 50 of a part of an optical semiconductor device 100B of a second embodiment. As illustrated in FIG. 8, in the present embodiment, the heater layer 30 does not have a side wall 32 (see FIGS. 4 and 5) in the entire region, but has a top wall 31 and a side wall 33. Furthermore, when viewed in the direction opposite to the Z direction, the heater layer 30 is located away from a side surface **20*b*1 of the mesa 20-2C toward a side close to a side surface 20*b*2 and is located to be close to the side surface 20*b*2 in an entire region of a section 30-2 on the mesa 20-2C. Moreover, an end edge 30*a* is separated from the side surface 20*b*1 of the mesa 20-2C toward the side close to the side surface 20*b*2. The section 30-2** is an example of a second heater layer.

Even in such a configuration, the heater layer 30 provided in the mesa 20-2C is positioned to be spaced from the mesa 20-2L in a portion close to a branch portion J. Therefore, according to the present embodiment, the same effects as those of the first embodiment can be obtained.

Third Embodiment

Figure 9:
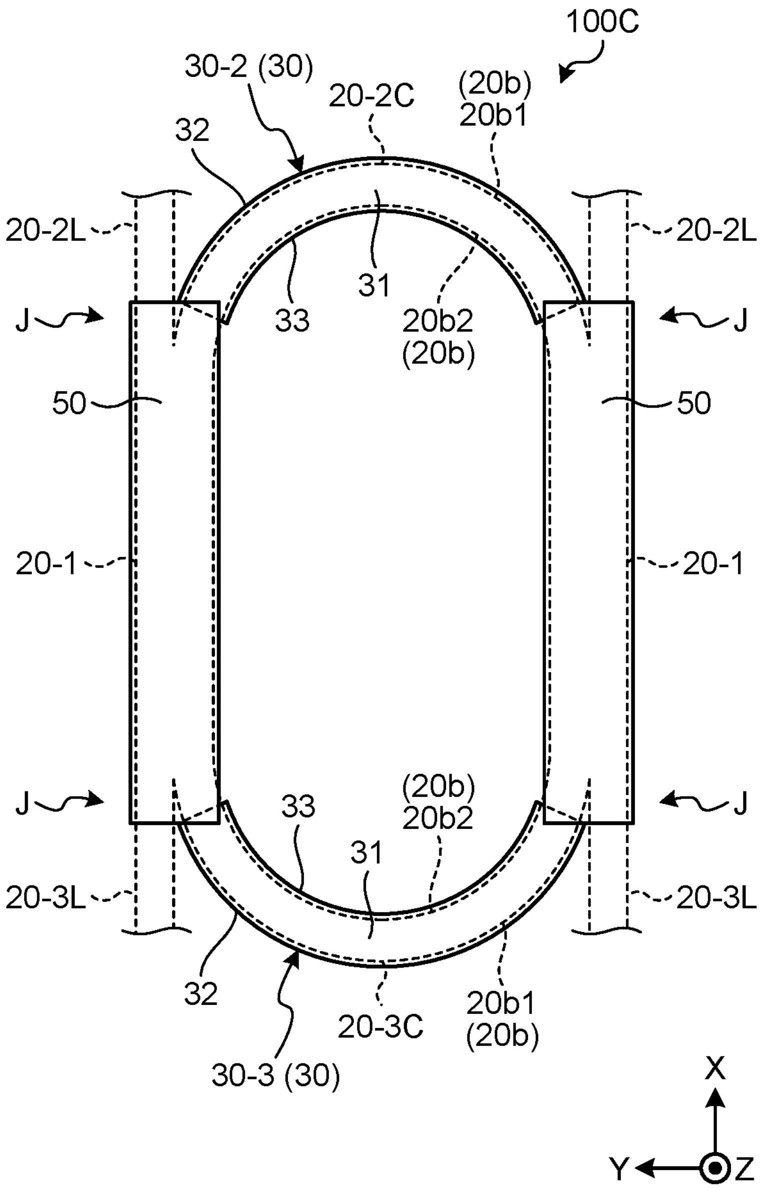
FIG. 9 is an exemplary schematic plan view illustrating a mesa and a heater layer in the vicinity of a branch portion of an optical semiconductor device according to a third embodiment.

FIG. 9 is a plan view illustrating mesas 20-1, 20-2L, 20-3L, and 20-3C, a heater layer 30, and a wiring layer 50 of a part of an optical semiconductor device 100C according to a third embodiment. As illustrated in FIG. 9, when viewed in the opposite direction of the Z direction, the mesa 20-2L and the mesa 20-3L, the mesa 20-2C and the mesa 20-3C, and a section 30-2 of the heater layer 30 and a section 30-3 of the heater layer 30 are provided line-symmetrically with respect to an imaginary center line passing through a center in the X direction and along the Y direction.

The mesa 20-3L and the mesa 20-3C branch from the mesa 20-1 at an end in the opposite direction of the X direction of the mesa 20-1, and extend away from each other in the Y direction toward the opposite direction of the X direction. The mesa 20-3L and the mesa 20-3C are examples of a plurality of third mesas.

Furthermore, the mesa 20-3C has a side surface 20*b*1 close to the mesa 20-3L adjacent in the Y direction and a side surface 20*b*2 far from the mesa 20-3L.

The section 30-3 of the heater layer 30 is provided in a portion of the mesa 20-3C away from the mesa 20-1. The section 30-3 of the heater layer 30 is an example of a third heater layer.

Also in the present embodiment, the heater layers 30 (30-2 and 30-3) provided in the mesas 20-2C and 20-3C are separated from the branch portion J and the mesas 20-2L and 20-3L. Therefore, according to the present embodiment, the same effects as those of the first embodiment can be obtained.

Furthermore, also in the present embodiment, the heater layer 30 has side walls 32 and 33. Therefore, also according to the present embodiment, for example, it is possible to increase the heating efficiency by the heater layer 30 and to suppress the temperature rise per unit area of the surfaces of the mesas 20-2C and 20-3C. Note that the heater layer 30 may have at least one of the side walls 32 and 33.

Moreover, in the present embodiment, the wiring layer 50 extending along the two mesas 20-1 is provided so as to cover the two mesas 20-1, and a circuit in which the section 30-2 of the heater layer 30 is interposed and a circuit in which the section 30-3 of the heater layer 30 is interposed are provided in parallel between the two wiring layers 50. According to the present embodiment, for example, a region between the sections 30-2 and 30-3 of the two heater layers 30 on the mesa 20-1 can be effectively used as a region where the wiring layers 50 are provided.

Note that one wiring layer 50 of the two wiring layers 50 is separated into two at an intermediate position in the X direction, and a positive electrode of a DC power supply is connected to one of the separated portions and a negative electrode is connected to the other, whereby a circuit in which the sections 30-2 and 30-3 of the two heater layers 30 are connected in series can be configured.

Fourth Embodiment

Figure 10:
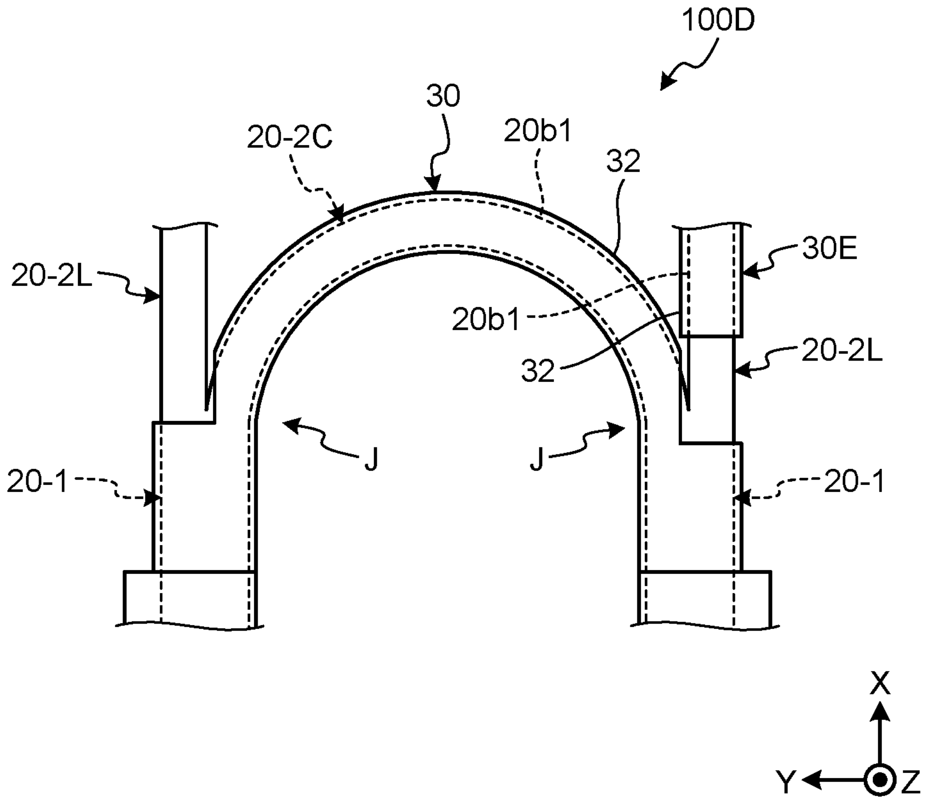
FIG. 10 is an exemplary schematic plan view illustrating a mesa, a heater layer, and a wiring layer of a part of an optical semiconductor device according to a fourth embodiment.

FIG. 10 is a plan view illustrating mesas 20-1, 20-2L, and 20-2C, a heater layer 30, and a wiring layer 50 of a part of an optical semiconductor device 100D of a fourth embodiment. As illustrated in FIG. 10, in the present embodiment, the optical semiconductor device 100D includes the heater layer 30 similar to that of the first embodiment, and a heater layer 30E provided in the mesa 20-2L.

As is clear from FIG. 10, the heater layer 30 is separated from the mesa 20-2L provided with the heater layer 30E, and is also separated from the heater layer 30E provided in the mesa 20-2L. Furthermore, the heater layer 30E is separated from the mesa 20-2C provided with the heater layer 30, and is also separated from the heater layer 30 provided in the mesa 20-2C. Therefore, according to the present embodiment, the same effects as those of the first embodiment can be obtained.

Fifth Embodiment

Figure 11:
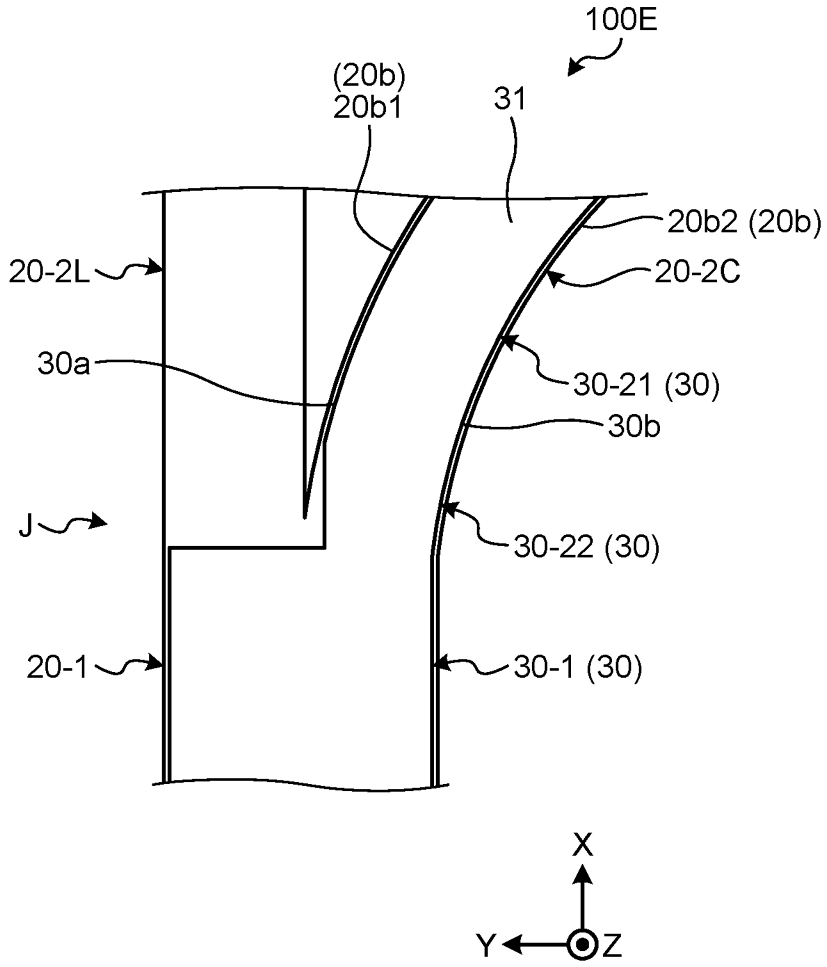
FIG. 11 is an exemplary schematic plan view illustrating a mesa and a heater layer in the vicinity of a branch portion of an optical semiconductor device according to a fifth embodiment.

FIG. 11 is a plan view of mesas 20-1, 20-2L, and 20-2C and a heater layer 30 in the vicinity of a branch portion J of an optical semiconductor device 100E of a fifth embodiment. As illustrated in FIG. 11, the heater layer 30 does not include side walls 32 and 33. Therefore, when viewed in the direction opposite to the Z direction, an end edge 30*a* does not protrude from the mesas 20-1, 20-2L, and 20-2C in the width direction, and is located at the same position as a side surface 20*b* or is located inside the side surface 20*b* in the width direction.

The optical semiconductor device 100E of the present embodiment has the same configuration as that of the first embodiment except that the side walls 32 and 33 are not provided. That is, when viewed in the opposite direction of the Z direction, in a section 30-22, the end edge 30*a* approaches a side surface 20*b*2 as approaching the mesa 20-1, the section 30-1, and a root of the branch portion J. That is, in the section 30-22, the end edge 30*a* is located closer to the side surface 20*b*2 than a section 30-21.

Also in the present embodiment, the heater layer 30 provided in the mesa 20-2C is separated from the branch portion J and the mesa 20-2L. Therefore, according to the present embodiment, the same effects as those of the first embodiment can be obtained.

Sixth Embodiment

Figure 12:
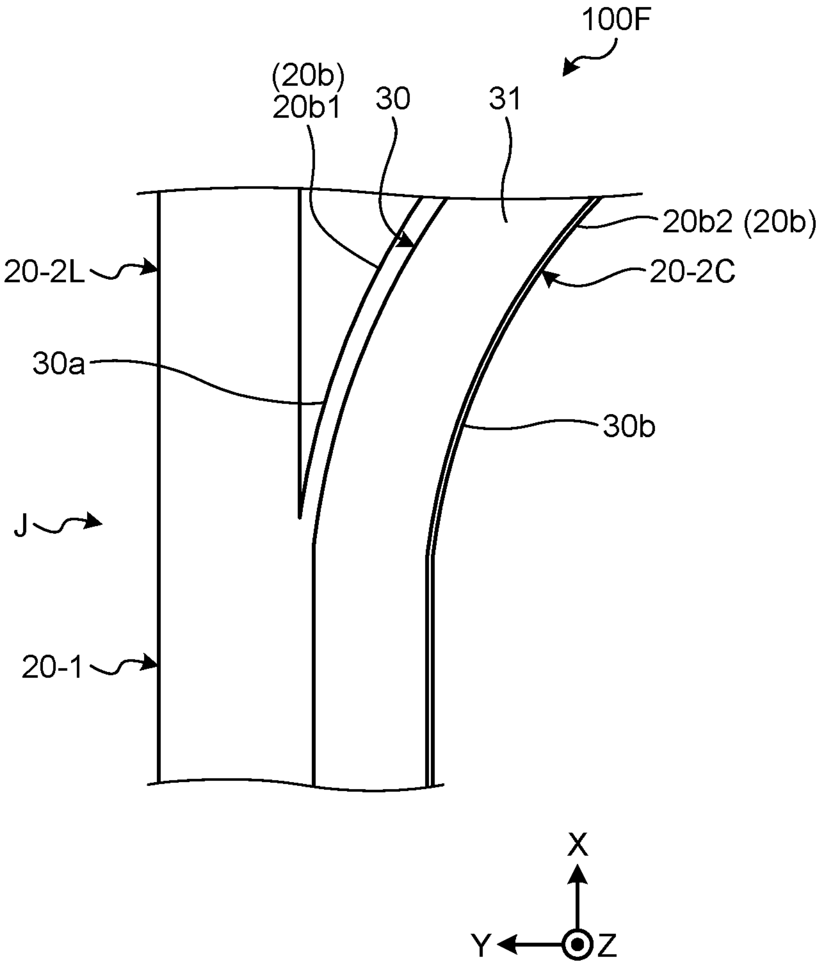
FIG. 12 is an exemplary schematic plan view illustrating a mesa and a heater layer in the vicinity of a branch portion of an optical semiconductor device according to a sixth embodiment.

FIG. 12 is a plan view of mesas 20-1, 20-2L, and 20-2C and a heater layer 30 in the vicinity of a branch portion J of an optical semiconductor device 100F according to a sixth embodiment. As illustrated in FIG. 12, the heater layer 30 does not include side walls 32 and 33. When viewed in the direction opposite to the Z direction, an end edge 30*a* does not protrude from the mesas 20-1, 20-2L, and 20-2C in the width direction, and is located at the same position as a side surface 20*b* or and is located inside the side surface 20*b* in the width direction.

The optical semiconductor device 100F of the present embodiment has the same configuration as that of the second embodiment except that the heater layer 30 does not have the side wall 33. That is, when viewed in the opposite direction of the Z direction, the heater layer 30 is located away from a side surface 20*b*1 of the mesa 20-2C toward a side close to a side surface 20*b*2 and close to the side surface 20*b*2 in an entire region of a section 30-2 on the mesa 20-2C. Moreover, an end edge 30*a* is separated from the side surface 20*b*1 of the mesa 20-2C toward the side close to the side surface 20*b*2.

Also in the present embodiment, the heater layer 30 provided in the mesa 20-2C is separated from the branch portion J and the mesa 20-2L. Therefore, according to the present embodiment, the same effects as those of the first embodiment can be obtained.

Seventh Embodiment

Figure 13:
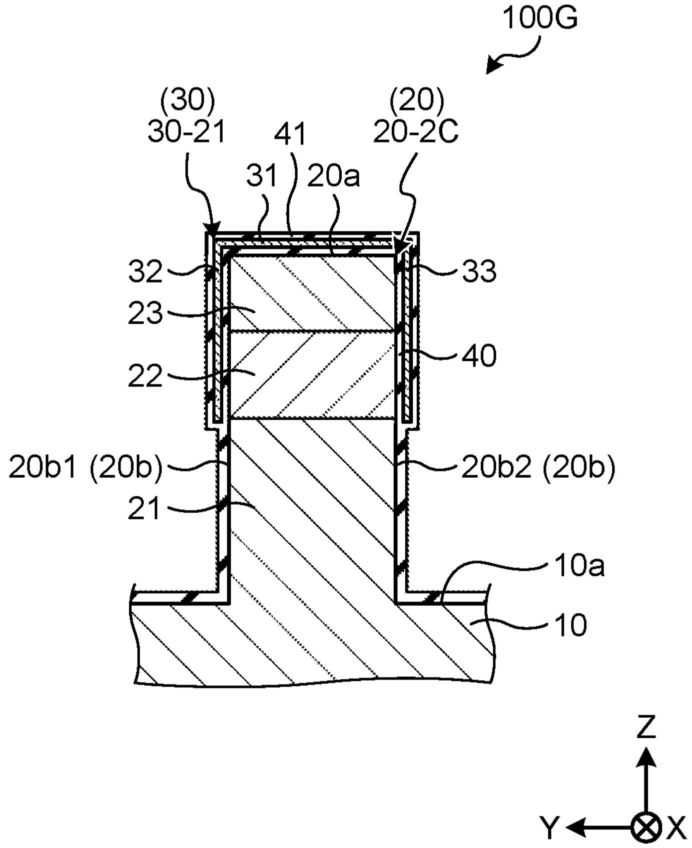
FIG. 13 is an exemplary schematic cross-sectional view of an optical semiconductor device according to a seventh embodiment at the same position as FIG. 4.

FIG. 13 is a cross-sectional view of an optical semiconductor device 100G of a seventh embodiment at the same position as FIG. 4.

As is clear from comparison between FIG. 13 and FIG. 4, in the present embodiment, lengths in the Z direction of side walls 32 and 33 in a section 30-21 of a heater layer 30 are longer than those in the first embodiment. Therefore, according to the present embodiment, the cross-sectional area of the heater layer 30 can be further increased. Therefore, for example, it is possible to obtain advantages that the heating efficiency by the heater layer 30 can be further enhanced, and the reliability can be further enhanced by further suppressing the local excessive temperature rise of the optical semiconductor device 100G.

Furthermore, in the present embodiment, for example, a waveguide layer 22 and the side walls 32 and 33 overlap in the width direction of the mesa 20-2C. A covering layer 40 is interposed between the waveguide layer 22 and the side walls 32 and 33.

According to such a configuration, for example, in a configuration in which the side walls 32 and 33 extend to a position overlapping the waveguide layer 22 in the Y direction, leakage of light from the waveguide layer 22 to the side walls 32 and 33 having relatively high absorbability of light can be suppressed by the covering layer 40.

Eighth Embodiment

Figure 14:
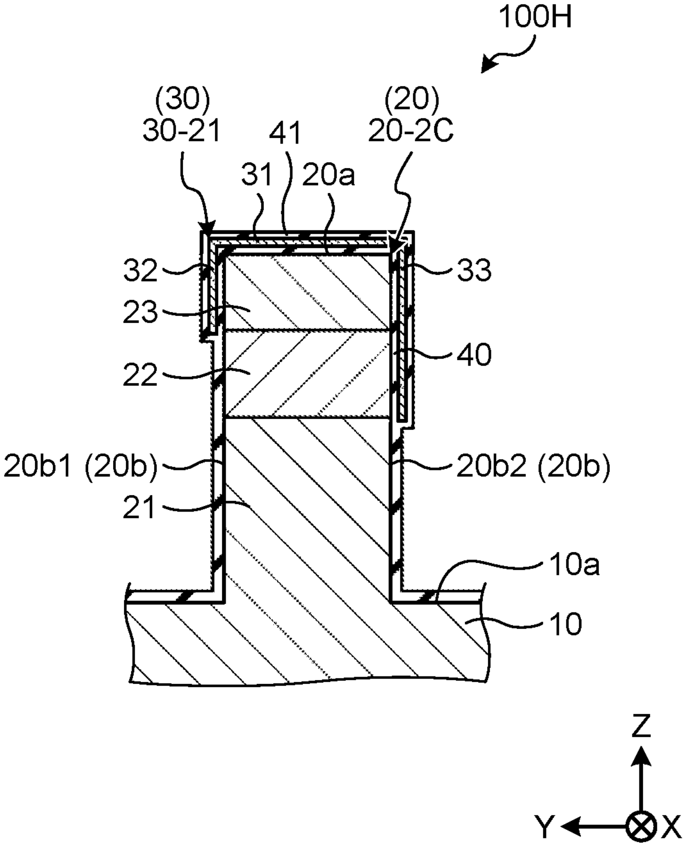
FIG. 14 is an exemplary schematic cross-sectional view of an optical semiconductor device according to an eighth embodiment at the same position as FIG. 4.

FIG. 14 is a cross-sectional view of an optical semiconductor device 100H according to an eighth embodiment at the same position as FIG. 4.

In the present embodiment, lengths of side walls 32 and 33 of a heater layer 30 in the Z direction are different from each other. Also with such a configuration, the effect of the heater layer 30 having the side walls 32 and 33 and increasing the cross-sectional area of the heater layer 30 can be obtained.

Ninth Embodiment

Figure 15:
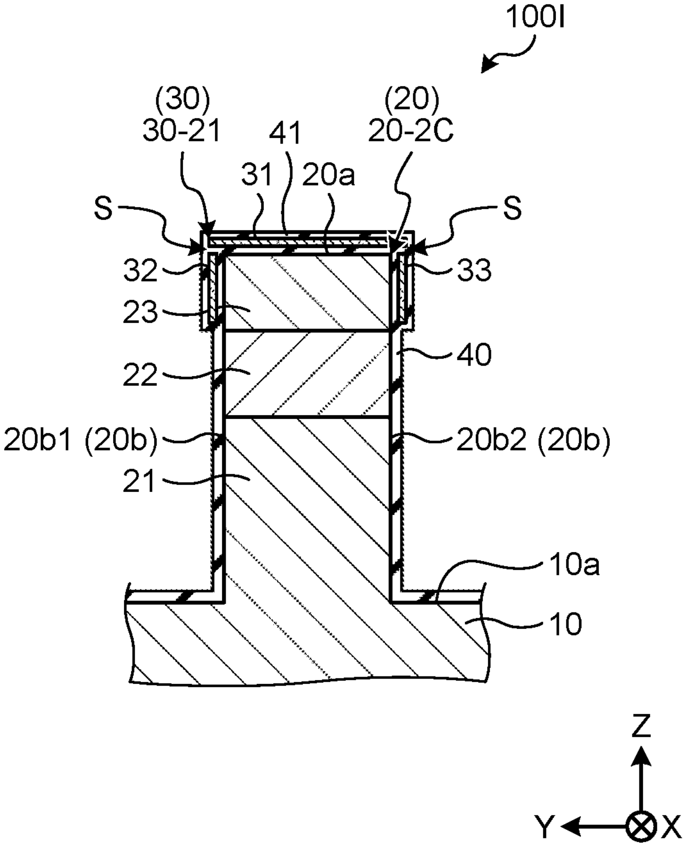
FIG. 15 is an exemplary schematic cross-sectional view of an optical semiconductor device according to a ninth embodiment at the same position as FIG. 4.

FIG. 15 is a cross-sectional view of an optical semiconductor device 100I according to a ninth embodiment at the same position as FIG. 4.

In the present embodiment, a slit S is provided between a top wall 31 and side walls 32 and 33 in a section 30-21 of a heater layer 30. Here, the top wall 31, the side wall 32, and the side wall 33 constitute a parallel thermoelectric circuit. Therefore, also according to the present embodiment, the effect of the heater layer 30 having the side walls 32 and 33 and increasing the cross-sectional area of the heater layer 30 can be obtained.

Tenth Embodiment

Figure 16:
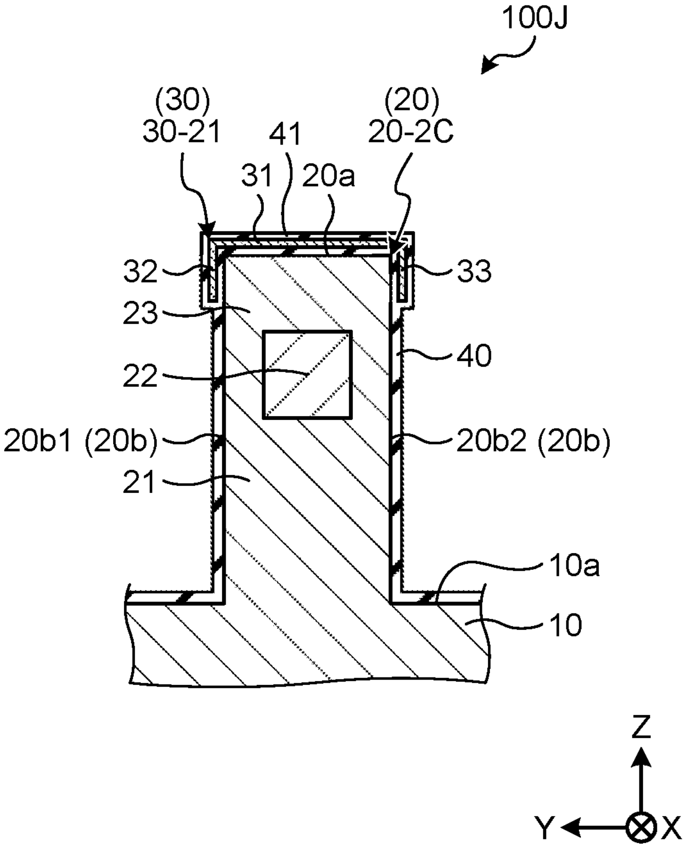
FIG. 16 is an exemplary schematic cross-sectional view of an optical semiconductor device according to a tenth embodiment at the same position as FIG. 4.

FIG. 16 is a cross-sectional view of an optical semiconductor device 100J of a tenth embodiment at the same position as FIG. 4.

In the present embodiment, a width of a waveguide layer 22 is shorter than a width of a mesa 20-2C, and both sides of the waveguide layer 22 in the width direction are covered with cladding layers 21 and 23 of the mesa 20-2C. That is, the mesa 20-2C has a configuration of a so-called embedded mesa. Also according to the present embodiment, a heater layer 30 has side walls 32 and 33, and the effect of increasing the cross-sectional area of the heater layer 30 can be obtained.

Eleventh Embodiment

Figure 17:
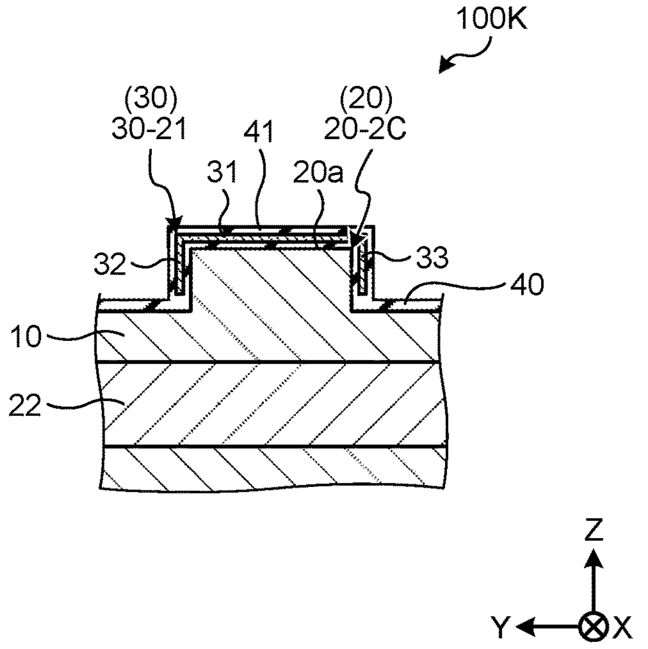
FIG. 17 is an exemplary schematic cross-sectional view of an optical semiconductor device according to an eleventh embodiment at the same position as FIG. 4.

FIG. 17 is a cross-sectional view of an optical semiconductor device 100K of an eleventh embodiment at the same position as FIG. 4.

In the present embodiment, a waveguide layer 22 is provided in a base 10 away from a mesa 20-2C in the opposite direction of the Z direction. That is, the mesa 20-2C has a so-called low mesa configuration. In this case, light is guided by being confined in a region located in the opposite direction of the Z direction with respect to the mesa 20-2C in the waveguide layer 22 by the mesa 20-2C. Also according to the present embodiment, a heater layer 30 has side walls 32 and 33, and the effect of increasing the cross-sectional area of the heater layer 30 can be obtained.

Twelfth Embodiment

Figure 18:
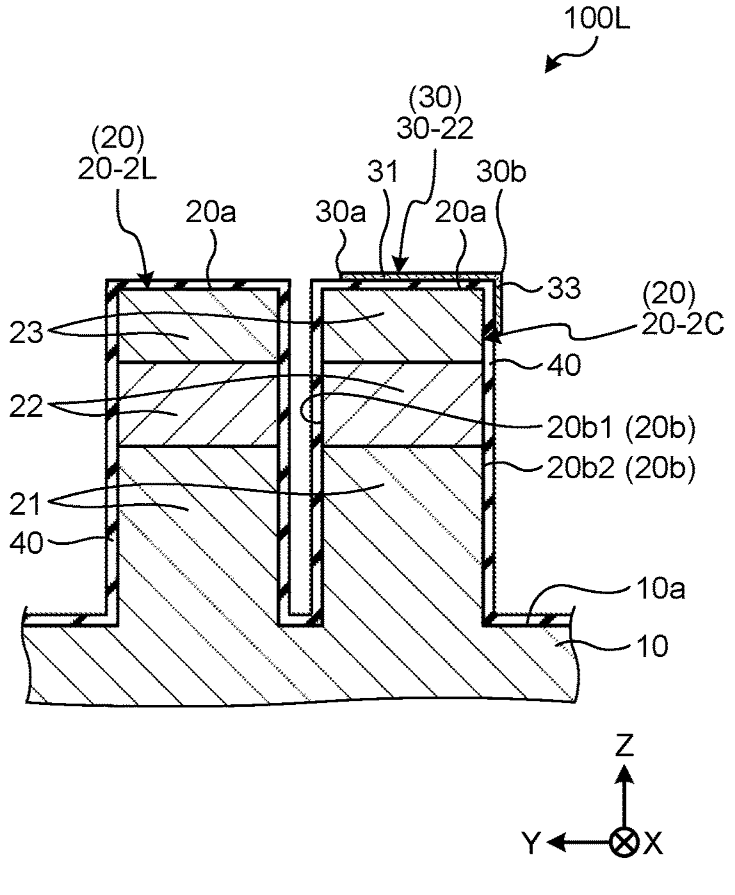
FIG. 18 is an exemplary schematic cross-sectional view of an optical semiconductor device according to a twelfth embodiment at the same position as FIG. 6.

FIG. 18 is a cross-sectional view of an optical semiconductor device 100L according to a twelfth embodiment at the same position as FIG. 6. As illustrated in FIG. 18, in the present embodiment, a covering layer 41 covering the outside of a heater layer 30 is not provided, and the heater layer 30 is exposed. Also in such a configuration, as in the above-described embodiment, in a section 30-22, an end edge 30*a* approaches a side surface 20*b*2 as approaching a mesa 20-1, a section 30-1, and a root of a branch portion J. That is, in the section 30-22, the end edge 30*a* is located closer to the side surface 20*b*2 than a section 30-21. That is, in the heater layer 30 (sections 30-21 and 30-22) provided in a mesa 20-2C, the section 30-22 as an end close to the mesa 20-1 and adjacent to the mesa 20-1 is spaced from a mesa 20-2L.

Even in the optical semiconductor device 100L without the covering layer 41 as in the present embodiment, it is possible to avoid a situation in which the mesa 20-2L is damaged by an overhanging portion 30*p* as illustrated in FIG. 7. That is, even in the configuration in which the covering layer 41 is not provided, it is possible to avoid an inconvenient event caused by provision of the heater layer 30, and to enhance reliability of the optical semiconductor device 100L. The effects of each of the above embodiments can be similarly obtained even in a configuration in which the covering layer 41 is not provided.

Thirteenth Embodiment

Figure 19:
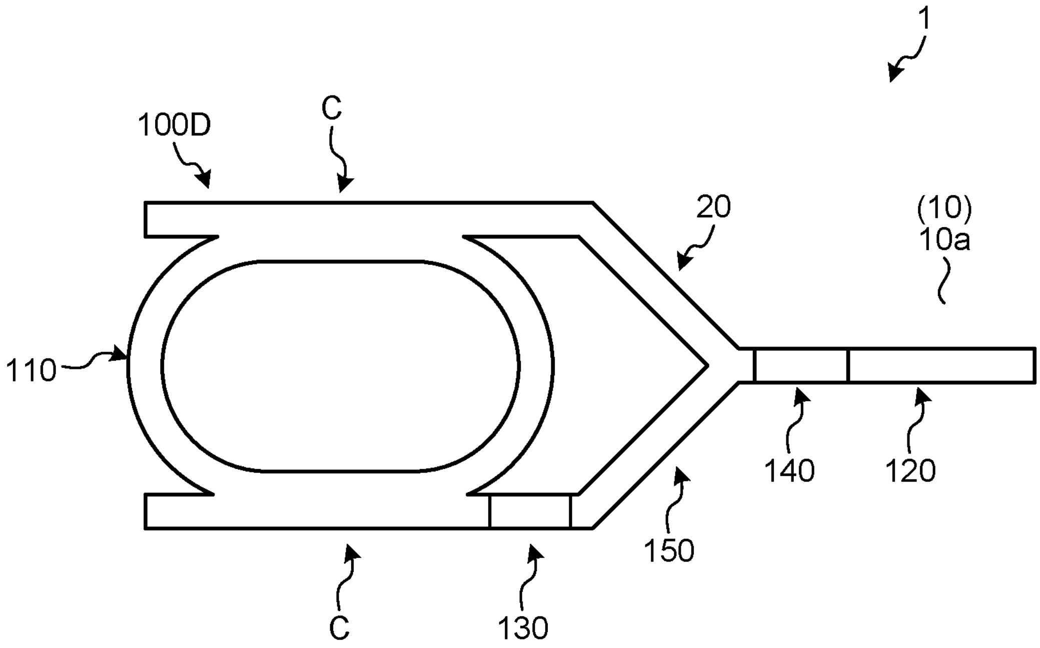
FIG. 19 is an exemplary schematic plan view of a wavelength-tunable laser device according to a thirteenth embodiment.

FIG. 19 is a schematic configuration diagram of a wavelength-tunable laser device 1 as an optical device according to a thirteenth embodiment. The wavelength-tunable laser device 1 includes a ring resonator 110, a sampled-grating distributed Bragg reflector (SG-DBR) unit 120, a phase adjustment unit 130, a gain unit 140, and a connection unit 150. The wavelength-tunable laser device 1 includes a wavelength-tunable laser resonator using a vernier effect, and constitutes a wavelength-tunable light source that outputs laser light in a wavelength-tunable manner.

The wavelength-tunable laser device 1 is configured to have a predetermined function such as a waveguide layer or an active layer (not illustrated) in a mesa 20 provided on a surface 10*a* of a base 10 as a semiconductor multilayer substrate, for example.

The ring resonator 110, the SG-DBR unit 120, the phase adjustment unit 130, the gain unit 140, and the connection unit 150 are made of, for example, an InP-based semiconductor material.

The SG-DBR unit 120 has a waveguide including a configuration of a distributed Bragg reflection sampled-grating (SG-DBR). The SG-DBR unit 120 constitutes one reflector of the laser resonator.

The gain unit 140 includes an active layer. The gain unit 140 is provided with a pair of electrodes (not illustrated) separated from each other, and by applying a voltage to the pair of electrodes, a current flows through the active layer, and a light amplification effect is obtained. As a result, laser oscillation occurs.

The connection unit 150 is branched at a branch portion, such as a 1×2 MMI coupler, optically connected to the gain unit 140, and includes two mesas 20 each bent in a plan view seen in the opposite direction of the Z direction. A waveguide layer of each of the mesas 20 is optically connected to a waveguide layer of the elliptical or annular mesa 20 of the ring resonator 110 at the coupling portion C by a 2×2 MMI coupler or the like.

The ring resonator 110 has a reflection spectrum characteristic having a comb peak having a period different from that of the SG-DBR unit 120 in combination with the connection unit 150, and constitutes the other reflector of the laser resonator.

The active layer has, for example, a multi quantum well (MQW) structure made of a GaInAsP-based semiconductor material or an AlGaInAs-based semiconductor material. The passive waveguide is made of, for example, an i-type GaInAsP-based semiconductor material having a bandgap wavelength of 1300 nm. The waveguide having the SG-DBR configuration is made of, for example, a GaInAsP-based semiconductor material or an AlGaInAs-based semiconductor material, and portions having different refractive indexes are periodically arranged such that a diffraction grating is formed.

The SG-DBR unit 120, the phase adjustment unit 130, and the mesa 20 of the ring resonator 110 are each provided with a heater layer 30 (However, not illustrated in FIG. 19.).

The SG-DBR unit 120 has comb-like reflection peaks at periodic frequency intervals according to the reciprocal of a period of the diffraction grating. The SG-DBR unit 120 and the ring resonator 110 have different periods, and have a configuration in which a frequency of the laser light can be roughly adjusted by a method called vernier type. When the heater layer 30 heats the SG-DBR unit 120, the refractive index of the SG-DBR unit 120 changes, whereby the comb-like reflection peak is shifted in a frequency axis direction. Similarly, when the heater layer 30 heats the ring resonator 110, the refractive index of the ring resonator 110 changes, and the comb-like reflection peak is shifted in the frequency axis direction.

Furthermore, the refractive index of the waveguide layer is changed by heating the heater layer 30 of the phase adjustment unit 130, whereby an optical length of the laser resonator can be adjusted. By adjusting the optical length of the laser resonator, it is possible to shift a frequency in the frequency axis direction while finely adjusting a frequency of a resonator mode (cavity mode). The fine adjustment of the resonator mode enables selection of the resonator mode in the laser oscillation, and enables a change in frequency in a slight range. Note that, in the present embodiment, the phase adjustment unit 130 is provided in a part of the connection unit 150 as an example, but the position where the phase adjustment unit 130 is provided is not limited to the connection unit 150.

As is clear from FIG. 19, for example, the optical semiconductor device 100D of the fourth embodiment can be applied to the mesa 20 of the portion where the ring resonator 110 and the mesa 20 of the connection unit 150 are optically connected by the coupling portion C. In this case, the heater layer 30 can be applied to the ring resonator 110, and the heater layer 30E can be applied to the phase adjustment unit 130. Furthermore, in this case, the mesa 20-1 corresponding to the coupling portion C can be configured as a 2×2 multimode interference waveguide. Note that instead of the optical semiconductor device 100D, the optical semiconductor device of the other embodiment described above may be incorporated in the wavelength-tunable laser device 1.

Although the embodiments of the disclosure have been exemplified above, the above embodiments are merely examples, and are not intended to limit the scope of the disclosure. The above-described embodiments can be implemented in various other forms, and various omissions, substitutions, combinations, and changes can be made without departing from the gist of the disclosure. Furthermore, specifications (structure, type, direction, model, size, length, width, thickness, height, number, arrangement, position, material, and the like) of each configuration, shape, and the like can be appropriately changed and implemented.

For example, the shape of the second mesa is not limited to the above embodiments, and the heater layer may be provided in the linearly extending second mesa. Furthermore, the number of second mesas may be three or more.

Furthermore, the covering layer that covers the mesa and the heater layer is not essential.

According to the disclosure, it is possible to obtain an optical semiconductor device having an improved novel configuration such as a configuration capable of improving reliability.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical semiconductor device comprising:

a base including a surface intersecting with a first direction;

a mesa protruding from the surface in the first direction, including a top surface and two side surfaces, and extending along the surface in a direction intersecting the first direction; and a heater layer including a top wall positioned on a side opposite to the base with respect to the top surface, the heater layer extending along the mesa, the mesa including a first mesa extending in a second direction intersecting the first direction, and a plurality of second mesas branching from the first mesa and extending so as to be away from each other in a third direction toward the second direction from the first mesa, the third direction intersecting both of the first direction and the second direction, each of the second mesas including a first side surface close to another second mesa adjacent in the third direction, and a second side surface far from the another adjacent second mesa, the heater layer including a first side wall provided in at least one of the second mesas, the first side wall extending from a position away from the first mesa along the first side surface so as to be away from the first mesa, wherein the heater layer further includes a first heater layer extending along the first mesa, and a second heater layer connected to the first heater layer and extending along the at least one of the second mesas, the second heater layer is provided at an end of a second mesa provided with the second heater layer, the end of the second mesa being adjacent to the first mesa, and the second heater layer is spaced from either another adjacent second mesa or a heater layer provided in the another adjacent second mesa, and the second heater layer includes, when viewed in a direction opposite to the first direction, a first end edge in a width direction of the second heater layer, the first end edge being closer to the first side surface than the second side surface, a second end edge in the width direction of the second heater layer, the second end edge being closer to the second side surface than the first side surface, a third portion away from the first mesa, and a fourth portion located between the third portion and the first mesa and located on a side where the first end edge is closer to the second side surface than the third portion.

2. The optical semiconductor device according to claim 1, further comprising a covering layer configured to cover the heater layer.

3. The optical semiconductor device according to claim 1, wherein the first side wall is separated from either another second mesa adjacent to a second mesa provided with the first side wall or a heater layer provided in the another second mesa adjacent to the second mesa provided with the first side wall.

4. The optical semiconductor device according to claim 1, wherein the heater layer includes, in the at least one of the second mesas, a first portion that is away from the first mesa and includes the first side wall, and a second portion that is closer to the first mesa than the first portion and does not include the first side wall.

5. The optical semiconductor device according to claim 1, wherein the heater layer further includes a second side wall extending along the second side surface on a side opposite to the first side surface.

6. The optical semiconductor device according to claim 1, wherein one of the plurality of second mesas is curved when viewed in a direction opposite to the first direction, and constitutes a part of a circumferential mesa.

7. The optical semiconductor device according to claim 6, wherein the circumferential mesa constitutes a ring resonator.

8. The optical semiconductor device according to claim 1, wherein one of the plurality of second mesas linearly extends at least at a portion adjacent to the first mesa when viewed in a direction opposite to the first direction.

9. The optical semiconductor device according to claim 1, wherein the first mesa constitutes a multimode interference waveguide.

10. An optical semiconductor device comprising:

a base including a surface intersecting with a first direction;

a mesa protruding from the surface in the first direction, including a top surface and two side surfaces, and extending along the surface in a direction intersecting the first direction; and a heater layer including a top wall positioned on a side opposite to the base with respect to the top surface, the heater layer extending along the mesa, the mesa including a first mesa extending in a second direction intersecting the first direction, and a plurality of second mesas branching from the first mesa and extending so as to be away from each other in a third direction toward the second direction from the first mesa, the third direction intersecting both of the first direction and the second direction, each of the second mesas including a first side surface close to another second mesa adjacent in the third direction, and a second side surface far from the another adjacent second mesa, the heater layer including a first side wall provided in at least one of the second mesas, the first side wall extending from a position away from the first mesa along the first side surface so as to be away from the first mesa, wherein the heater layer further includes a first heater layer extending along the first mesa, and a second heater layer connected to the first heater layer and extending along the at least one of the second mesas, the second heater layer is provided at an end of a second mesa provided with the second heater layer, the end of the second mesa being adjacent to the first mesa, the second heater layer is spaced from either another adjacent second mesa or a heater layer provided in the another adjacent second mesa, the second heater layer includes, when viewed in a direction opposite to the first direction, a first end edge in a width direction of the second heater layer, the first end edge being closer to the first side surface than the second side surface, and a second end edge in the width direction of the second heater layer, the second end edge being closer to the second side surface than the first side surface, and the first end edge approaches the second side surface as the first end edge approaches the first mesa.

11. The optical semiconductor device according to claim 10, wherein the first side wall is separated from either another second mesa adjacent to a second mesa provided with the first side wall or a heater layer provided in the another second mesa adjacent to the second mesa provided with the first side wall.

12. The optical semiconductor device according to claim 10, wherein the heater layer includes, in the at least one of the second mesas, a first portion that is away from the first mesa and includes the first side wall, and a second portion that is closer to the first mesa than the first portion and does not include the first side wall.

13. The optical semiconductor device according to claim 10, wherein the heater layer further includes a second side wall extending along the second side surface on a side opposite to the first side surface.

14. An optical semiconductor device comprising:

a base including a surface intersecting with a first direction;

a mesa protruding from the surface in the first direction, including a top surface and two side surfaces, and extending along the surface in a direction intersecting the first direction; and a heater layer including a top wall positioned on a side opposite to the base with respect to the top surface, the heater layer extending along the mesa, the mesa including a first mesa extending in a second direction intersecting the first direction, and a plurality of second mesas branching from the first mesa and extending so as to be away from each other in a third direction toward the second direction from the first mesa, the third direction intersecting both of the first direction and the second direction, each of the second mesas including a first side surface close to another second mesa adjacent in the third direction, and a second side surface far from the another adjacent second mesa, the heater layer including a first side wall provided in at least one of the second mesas, the first side wall extending from a position away from the first mesa along the first side surface so as to be away from the first mesa, wherein the heater layer further includes a first heater layer extending along the first mesa, and a second heater layer connected to the first heater layer and extending along the at least one of the second mesas, the second heater layer is provided at an end of a second mesa provided with the second heater layer, the end of the second mesa being adjacent to the first mesa, the second heater layer is spaced from either another adjacent second mesa or a heater layer provided in the another adjacent second mesa, and when viewed in a direction opposite to the first direction, in an entire region of the second heater layer, the second heater layer is located away from the first side surface toward a side close to the second side surface and is located to be close to the second side surface.

15. The optical semiconductor device according to claim 14, wherein the first side wall is separated from either another second mesa adjacent to a second mesa provided with the first side wall or a heater layer provided in the another second mesa adjacent to the second mesa provided with the first side wall.

16. The optical semiconductor device according to claim 14, wherein the heater layer includes, in the at least one of the second mesas, a first portion that is away from the first mesa and includes the first side wall, and a second portion that is closer to the first mesa than the first portion and does not include the first side wall.

17. The optical semiconductor device according to claim 14, wherein the heater layer further includes a second side wall extending along the second side surface on a side opposite to the first side surface.

18. An optical semiconductor device comprising:

a base including a surface intersecting with a first direction;

a mesa protruding from the surface in the first direction, including a top surface and two side surfaces, and extending along the surface in a direction intersecting the first direction; and a heater layer including a top wall positioned on a side opposite to the base with respect to the top surface, the heater layer extending along the mesa, the mesa including a first mesa extending in a second direction intersecting the first direction, and a plurality of second mesas branching from the first mesa and extending so as to be away from each other in a third direction toward the second direction from the first mesa, the third direction intersecting both of the first direction and the second direction, each of the second mesas including a first side surface close to another second mesa adjacent in the third direction, and a second side surface far from the another adjacent second mesa, the heater layer including a first side wall provided in at least one of the second mesas, the first side wall extending from a position away from the first mesa along the first side surface so as to be away from the first mesa, wherein the heater layer further includes a first heater layer extending along the first mesa, and a second heater layer connected to the first heater layer and extending along the at least one of the second mesas, the second heater layer is provided at an end of a second mesa provided with the second heater layer, the end of the second mesa being adjacent to the first mesa, and the second heater layer is spaced from either another adjacent second mesa or a heater layer provided in the another adjacent second mesa, and when viewed in a direction opposite to the first direction, the first heater layer extends along the first mesa with a width larger than a width of the second heater layer.

19. The optical semiconductor device according to claim 18, wherein the first side wall is separated from either another second mesa adjacent to a second mesa provided with the first side wall or a heater layer provided in the another second mesa adjacent to the second mesa provided with the first side wall.

20. The optical semiconductor device according to claim 18, wherein the heater layer includes, in the at least one of the second mesas, a first portion that is away from the first mesa and includes the first side wall, and a second portion that is closer to the first mesa than the first portion and does not include the first side wall.

* * * * *